United States Patent [19]
Van Roijen et al.

[11] Patent Number: 5,469,460
[45] Date of Patent: Nov. 21, 1995

[54] RING LASER

[75] Inventors: Raymond Van Roijen; Engelbertus C. M. Pennings, both of Eindhoven, Netherlands

[73] Assignee: U.S. Philips Corporation, New York, N.Y.

[21] Appl. No.: 304,106

[22] Filed: Sep. 9, 1994

[30] Foreign Application Priority Data

Sep. 10, 1993 [EP] European Pat. Off. .............. 93202635

[51] Int. Cl.$^6$ ................................................. H01S 3/083
[52] U.S. Cl. ............................. 372/94; 372/108; 372/64
[58] Field of Search ............................ 372/94, 64, 98, 372/108

[56] References Cited

U.S. PATENT DOCUMENTS 4,525,843  6/1985  Diels ......................................... 372/94

Primary Examiner—Leon Scott, Jr.
Attorney, Agent, or Firm—Michael J. Balconi-Lamica

[57] ABSTRACT

A ring laser is described, which has a ring (1) in which laser radiation is generated. A coupler (4) couples a part of the radiation in the form of two waves (7,8) to two waveguides (5,6). A combiner (11) combines the two waves to an output wave (12) in an output waveguide (13). By providing a reflector (16) in the output waveguide, a part of the output wave is reflected to the ring via the combiner, the two waveguides and the coupler. The radiation waves travelling in the ring couple to the reflected wave and thereby acquire a well-defined phase difference. The resultant phase equality of the two waves (7,8) at the input of the combiner ensures that the powers of the waves are added in phase so that the ring laser supplies the maximum possible power.

8 Claims, 2 Drawing Sheets

RING LASER

BACKGROUND OF THE INVENTION

The invention relates to a ring laser provided with a ring of semiconductor material for generating laser radiation, a coupler for coupling radiation out of the ring, two waveguides connected to the coupler, a combiner, two inputs of which are connected to the waveguides, and an output waveguide connected to an output of the combiner.

A ring laser of this type is known from the article "Very low threshold current operation of semiconductor ring lasers", IEEE Proceedings-J, vol. 139, no. 6, Dec. 1992 by T. Kraus and P. J. R. Laybourn. In the known semiconductor ring laser, radiation of two waves travelling in opposite directions in the ring are coupled into two waveguides by means of two Y junctions. The radiation in the two waveguides is combined in an output waveguide by means of an Y junction. A drawback of this ring laser is that it has a relatively low efficiency, i.e. the supplied optical power is low at a given electric input power.

SUMMARY OF THE INVENTION

It is, inter alia an object of the invention to provide a more efficient ring laser.

To this end, the ring laser according to the invention is characterized in that the ring laser is provided with means for giving the difference between the phases of the radiation applied to the two inputs of the combiner the maximum output power value which is characteristic of the combiner.

The invention is based on the recognition that the two radiation waves travelling in opposite directions in the ring of the known ring laser do not have a well-defined phase difference. In an ideal ring the phase difference will be completely arbitrary and vary with time. In a non-ideal ring the phase difference is determined by scattering of the waves on contaminations in the ring and by variations of the refractive index of the ring. The phase difference is also dependent on the electric input power of the ring laser which partly determines the temperature of the ring and hence the value of the refractive index. The phases of the waves in the two waveguides are coupled to the phases of the two waves in the ring so that the radiation waves at the two inputs of the combiner also have no well-defined phase difference. In the combiner the waves will interfere constructively or destructively, dependent on the phase difference. The optical power at the output of the combiner will then also be dependent on the phase difference. For the ideal ring the time-average power is approximately half the maximum possible power. For the non-ideal ring the power has a value of between zero and the maximum power, dependent on, inter alia the temperature and the applied electric power. The combiner will only give a maximum power coupling to the output if the phase difference of the radiation applied to the inputs has a characteristic value determined by the construction of the combiner. According to the invention, by assigning this characteristic value to the phase difference between the waves, the waves in the combiner will interfere constructively, which leads to an increase of the output power and renders the ring laser more efficient. For constructive interference the phase difference should deviate less than 30° from the characteristic value.

A first mode of bringing about the required phase difference of the waves is realised in a ring laser which is characterized in that the means comprise a reflector by which radiation emerging from the ring is partly reflected to the ring. The two radiation waves travelling in the ring will couple to the radiation reflected into the ring in such a way that the phase difference of the two waves is no longer determined by contaminations, but by the reflected radiation. For a well-defined reflection, the phase difference of the two waves is also well defined.

A preferred embodiment of the ring laser according to the invention is characterized in that the reflector is present in the output waveguide. The reflector may consist of a change of the refractive index of the material of the output waveguide or a change of the cross-section of the output waveguide. The wave reflected on the reflector will be split into two sub-waves by the combiner which operates as a splitter for this wave, which two sub-waves have a phase which is characteristic of the combiner. The two sub-waves travel through the two waveguides to the ring where they couple to the waves travelling in the ring. Due to the phase difference between the two sub-waves, the two waves generated in the ring will have also the same phase difference at the inputs of the combiner. The provision of a reflector in an output waveguide is a measure which runs counter to the customary assumption that radiation from a laser must be further guided with a minimum possible loss of reflection so as to obtain a maximum possible output power.

Another preferred embodiment of the ring laser according to the invention is characterized in that the reflector is present in the combiner. The reflector is then constituted by a small modification of the dimensions or the refractive index of the combiner, which modification realises a reflection leading to the required phase difference.

A second mode of bringing about the required phase difference of the waves at the inputs of the combiner is realised in a ring laser which is characterized in that the means for equalizing the phases comprise an electro-optical phase shifter. The phases of the waves at the inputs of the combiner can be rendered equal by means of a phase shifter in one or both waveguides between the ring and the combiner. The phase shifter is driven by an electric signal which is derived from a measurement of the output power of the ring laser.

A preferred embodiment of the ring laser according to the invention is characterized in that the ring, the coupler, the waveguides, the combiner and the output waveguide are integrated on a single substrate. The components of the ring laser are very suitable for integration and a compact high-power laser can be obtained by integration.

A preferred embodiment of the ring laser according to the invention is characterized in that the combiner is a multimode imaging component. Since a multimode imaging component has smaller losses than an Y junction, a multimode imaging combiner yields an increase of the output power.

A preferred embodiment of the ring laser according to the invention is characterized in that the coupler is a multimode imaging component. A further reduction of the losses in the ring laser and hence a larger output power can thereby be obtained. A further advantage of a multimode imaging coupler is that the coupling efficiency is comparatively insensitive to the radiation distribution in the propagation modi of the waves to be coupled out of the ring. These modi change upon a change of the temperature, hence of the refractive index. The coupling efficiency of an Y junction is very sensitive to the exact form of the radiation distribution in the modi, so that small temperature changes have a drastic effect on the output power. However, the output power of a ring laser with a multimode imaging coupler is comparatively insensitive to temperature changes.

BRIEF DESCRIPTION OF THE DRAWINGS

These and other aspects of the invention will be apparent from and elucidated with reference to the embodiments described hereinafter.

In the drawings

DETAILED DESCRIPTION OF THE PREFERRED EMBODIMENT

Figure 1:
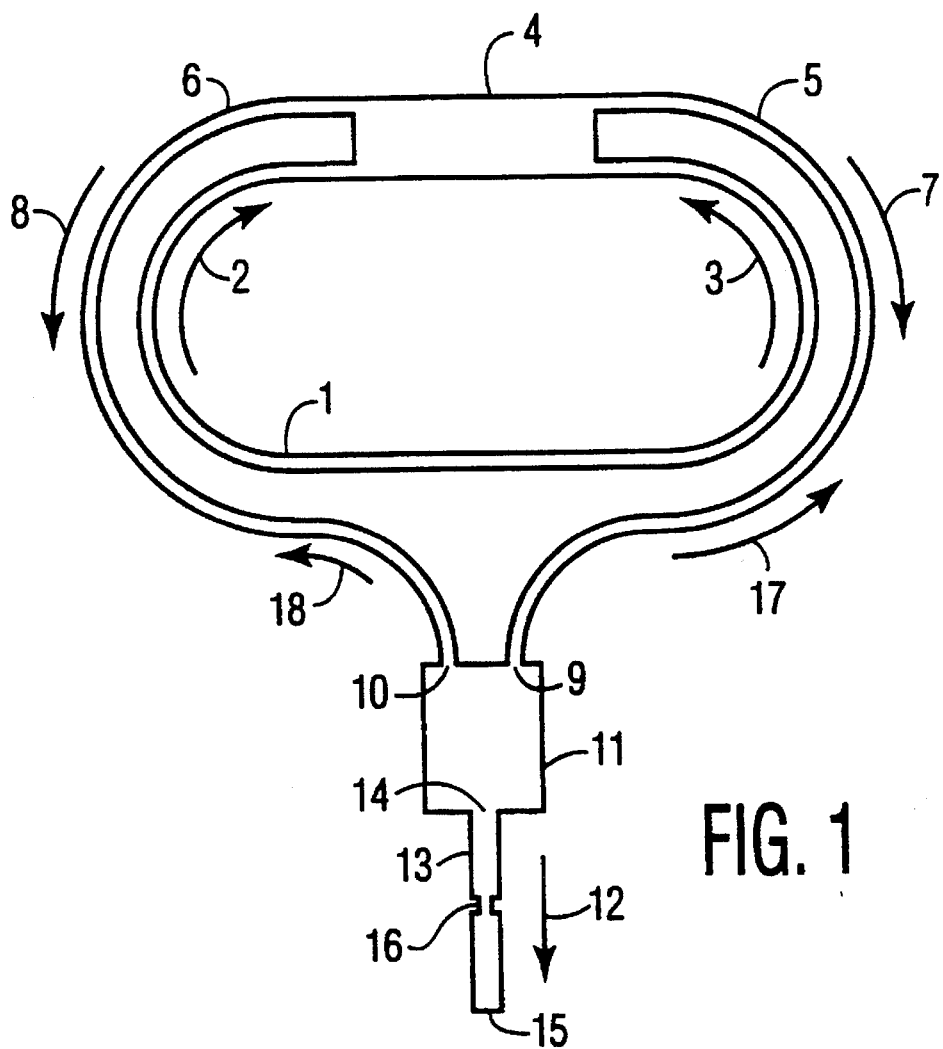
FIG. 1 shows a first embodiment of the ring laser according to the invention.

FIG. 1 shows a first embodiment of the ring laser according to the invention. The ring laser is provided with a waveguide in the form of a ring 1 in which radiation waves 2 and 3 travelling clockwise and counterclockwise, respectively, are generated. A coupler 4 couples a part of the clockwise travelling wave 2 out of the ring as wave 7 towards a waveguide 5 and a part of the counterclockwise travelling wave 3 as wave 8 towards a waveguide 6. The waveguides 5 and 6 are connected to inputs 9 and 10, respectively, of a combiner 11. The combiner combines the waves 7 and 8 in the waveguides 5 and 6, respectively, to an output wave 12 which propagates in an output waveguide 13 which is connected to an output 14 of the combiner. The characteristic phase difference for the combiner shown is 0°, i.e. the radiation applied to the inputs 9, 10 should be in phase so as to obtain a maximum power coupling towards the output 14.

The components of the ring laser are deep-etched semiconductor structures integrated on a single InP substrate. The laser layer packet consists of a quaternary semiconductor layer of InGaAsP having a thickness of 0.15 µm and an emission wavelength of 1.6 µm, a 1.9 µm thick layer of p-InP and a 0.2 µm thick contact layer of p-InGaAs, all provided by means of metal-organic vapour-phase epitaxy (MO-VPE). The waveguides in the packet have a width of 2.5 µm and are defined by a 3 µm deep duct at both sides of the waveguides. The ducts are made by means of reactive ion etching with $Cl_2$. Subsequently a layer of SiN is grown on the entire structure by means of plasma-chemical vapour deposition (plasma-CVD) whereafter this layer is removed at the location of the components. A metal layer is provided on the entire ring laser by means of sputtering. According to the invention, the output waveguide is provided at both sides with a constriction 16 of approximately 0.5 µm which functions as a reflector. After cleaving the substrate, the facet 15 at the end of the output waveguide 13 is provided with an anti-reflection coating so as to be able to perform power measurements on the ring laser. In most applications, however, the ring laser will be incorporated in an integrated circuit in which the output waveguide 15 guides the radiation towards another component of the circuit without a transition between semiconductor material and air.

In a realised embodiment of the ring laser the radius of curvature of the ring 1 is 150 µm, which is a compromise between a ring laser which is as small as possible and a minimum possible radiation loss in the ring. The coupler 4 is a 3 dB multimode imaging (MMI) coupler having low losses and wide manufacturing tolerances. MMI components are known, inter alia from German Patent Specification no. DE 25 06 272. The MMI coupler has a length of 208 µm and a width of 7 µm. The combiner 11 is also an MMI component having a length of 68 µm and a width of 8 µm, while the space between the two inputs 9 and 10 is equal to 1.5 µm.

Measurements of the output power coming through the facet 15 show that the spectrum of the ring laser comprises a single mode up to powers of 9 mW at an electric current of 0.5 A through the ring laser. The high efficiency of the ring laser and the stability of the output power are due to the reflection of a part of the output power at the constriction 16. The reflected wave will be split by the combiner 11, which operates as a splitter for this wave, into two sub-waves 17, 18 having the same phase. The two sub-waves travel through the two waveguides 5, 6 towards the ring 1 where they couple to waves travelling in the ring and impress a phase thereon. Due to the equal phases of the two sub-waves, the two waves 2, 3 generated in the ring will also have equal phases at the inputs 9, 10 of the combiner after they have been coupled out of the ring. Due to this phase difference of 0° at the inputs, the combiner operates as a power adder so that the maximum power is available at the output 14.

The phase coupling of the two waves 2, 3 travelling in opposite directions in the ring already occurs at a reflection of 0.01%. A stable action of the ring laser was observed at reflections of more than 0.1%. The reflection should be preferably smaller than 25%, because larger reflections lead to a decrease of the output power. If the reflection is large, the waveguides 5, 6 and 13 behave as a Fabry-Perot laser with the reflector 16 as an end mirror. This Fabry-Perot laser couples with the ring, which leads to coupled modi of the Fabry-Perot and the ring. These coupled modi in turn lead to excessive mode-hopping so that the ring laser will be less stable and the output power decreases.

The reflection may alternatively be realised by providing a transverse constriction in the upper side of the output waveguide. The InP layer, which functions as a cladding layer for the InGaAsP layer in which the waves mainly propagate, is then reduced to a thickness of, for example 0.5 µm over a small length. Another implementation of the reflector is an offset of the longitudinal axis of the output waveguide through, for example 0.2 µm. The transition between areas having different refractive indices may also function as a reflector. Such a transition can easily be made by changing the material of the waveguide at a location in the output waveguide or in the output 14 of the combiner 11. To obtain a reflection within the preferred range, it will be necessary in some cases to provide an extra transition layer on the transition, which layer has a refractive index between those of the adjacent materials. The reflector may be a possibly integrated grating or ring reflector.

Figure 2:
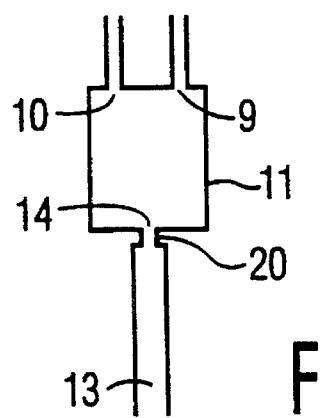
FIG. 2 shows an MMI combiner with a constriction.

The MMI combiner 11 may function as a reflector. The reflection from the output 14 to the inputs 9, 10 of a well-designed MMI combiner is smaller than 0.01%. By slightly deviating from this design in different manners, the reflection according to the invention can easily be realised. In a first embodiment there is a constriction 20 of the waveguide at the location of the output 14 of the combiner, as is shown in FIG. 2. A part of the radiation impinging upon the plane of the output will thereby be reflected to the inputs 9, 10 of the combiner. In a second embodiment the length of the MMI combiner is changed approximately 5% with respect to the design value so that the reflection in the combiner increases. In a third embodiment the width of the combiner is changed by approximately 2% with respect to the design value. A combination of these three measures is alternatively possible.

Figure 3:
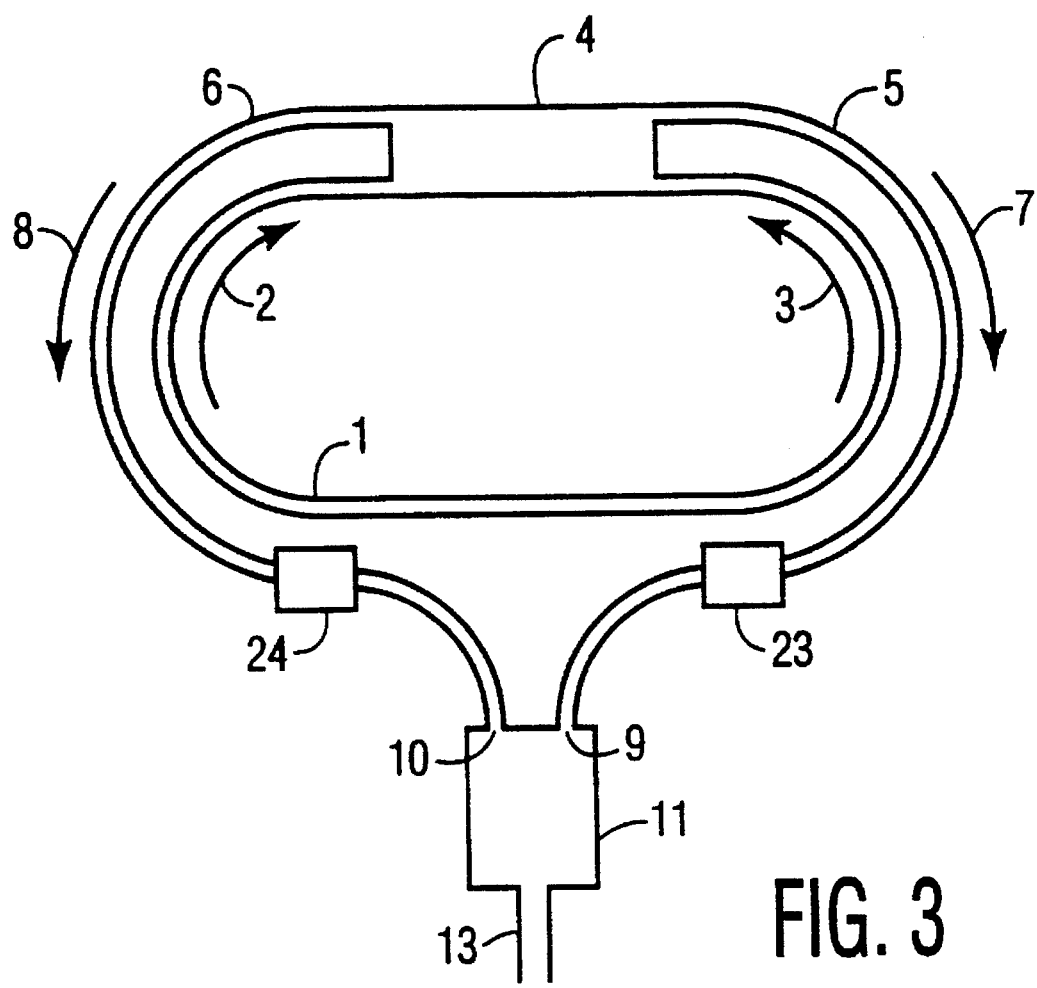
FIG. 3 shows a second embodiment of the ring laser.

FIG. 3 shows a ring laser in which the phases of the waves 7, 8 at the inputs 9, 10 of the combiner 11 are rendered equal in a second way. The waveguides 5, 6 are provided with two electro-optical phase shifters 23, 24 each being able to change the phase of the waves in the respective waveguide, dependent on an electric voltage at the inputs of the phase shifter. Such a phase shifter is known, inter alia from the article "Miniature Mach-Zehnder InGaAsP quantum well waveguide interferometers for 1.3 ||m", IEEE Photonics Technology Letters, vol. 2, no. 1, January 1990, pp. 32–34 by J. E. Zucker et at. By varying the voltage of the phase shifters and simultaneously measuring the change of the output power of the ring laser, it is possible to determine the voltages at which the output power is maximum. At these voltages the two waves 7, 8 at the inputs 9, 10 are in phase. By correct control of the voltages, the output power of the ring laser can be maintained at the maximum value under all circumstances. It is to be noted that the output power of the ring laser can be modulated by means of a special drive of the phase shifter(s).

It has been assumed in the foregoing that the phase difference between the waves arriving at the inputs 9, 10 of the combiner should be equal to zero for a maximum power coupling. This applies to a symmetrical combiner 11, as is shown in FIGS. 1–3. If an asymmetrical combiner is used, such as a combiner whose output 14 is offset to the left or the right with respect to the symmetrical position in FIGS. 1–3, the phase difference should be, for example 90°. Such a phase difference may also be realised in the manner described hereinbefore, hence with the same reflector in the output waveguide or in the combiner or by means of an electro-optical phase shifter in one or both waveguides between the coupler and the combiner.

The measures according to the invention are also applicable in a ring laser in which the coupler 4 and the combiner 11 are not MMI components but Y junctions, although the MMI components have a better efficiency than Y junctions.

We claim:

1. A ring laser comprising:

a ring of semiconductor material for generating laser radiation; two waveguides;

a coupler for coupling laser radiation in the form of two waves travelling clockwise and counterclockwise, respectively, emerging out of said ring to said two waveguides;

a combiner having two inputs connected to said two waveguides, respectively, and further having an output;

an output waveguide connected to the output of said combiner; and means for producing a well-defined phase difference in the laser radiation applied to the two inputs of said combiner to increase an output power, thereby rendering said ring laser more efficient.

2. The ring laser as claimed in claim 1, wherein said phase difference producing means comprises a reflector by which radiation emerging from said ring is partly reflected back to said ring.

3. The ring laser as claimed in claim 2, wherein the reflector is present in said output waveguide.

4. The ring laser as claimed in claim 2, wherein the reflector is present in said combiner.

5. The ring laser as claimed in claim 1, wherein said phase difference producing means comprises an electro-optical phase shifter in at least one of said two waveguides.

6. The ring laser as claimed in claim 1, wherein said ring, said coupler, said waveguides, said combiner and said output waveguide are integrated on a single substrate.

7. The ring laser as claimed in claim 1, wherein said combiner is a multimode imaging component.

8. A ring laser as claimed in claim 1, wherein said coupler is a multimode imaging component.

* * * * *